(12) United States Patent
Pinto

(10) Patent No.: US 7,897,447 B2
(45) Date of Patent: Mar. 1, 2011

(54) USE OF IN-SITU HCL ETCH TO ELIMINATE BY OXIDATION RECRYSTALLIZATION BORDER DEFECTS GENERATED DURING SOLID PHASE EPITAXY (SPE) IN THE FABRICATION OF NANO-SCALE CMOS TRANSISTORS USING DIRECT SILICON BOND SUBSTRATE (DSB) AND HYBRID ORIENTATION TECHNOLOGY (HOT)

(75) Inventor: Angelo Pinto, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 117 days.

(21) Appl. No.: 12/391,657

(22) Filed: Feb. 24, 2009

(65) Prior Publication Data

US 2010/0216286 A1 Aug. 26, 2010

(51) Int. Cl.
*H01L 21/8234* (2006.01)

(52) U.S. Cl. ... 438/198; 438/199; 438/275; 257/E21.632
(58) Field of Classification Search .................. 438/198, 438/199, 275, 150; 257/E21.632
See application file for complete search history.

(56) References Cited

U.S. PATENT DOCUMENTS

| 7,190,040 B2 * | 3/2007 | Liu | 257/499 |
| 2006/0275971 A1 * | 12/2006 | Fogel et al. | 438/198 |
| 2009/0130817 A1 * | 5/2009 | Pinto et al. | 438/424 |

\* cited by examiner

*Primary Examiner* — Michael Trinh
(74) *Attorney, Agent, or Firm* — Warren L. Franz; Wade J. Brady, III; Frederick J. Telecky, Jr.

(57) ABSTRACT

A method for reducing defects at an interface between a amorphized, recrystallized cleaved wafer layer and an unamorphized cleaved wafer layer can comprise an anneal and an exposure to hydrochloric acid. The anneal and acid exposure can be performed within an epitaxial reactor chamber to minimize wafer transport.

4 Claims, 3 Drawing Sheets

USE OF IN-SITU HCL ETCH TO ELIMINATE BY OXIDATION RECRYSTALLIZATION BORDER DEFECTS GENERATED DURING SOLID PHASE EPITAXY (SPE) IN THE FABRICATION OF NANO-SCALE CMOS TRANSISTORS USING DIRECT SILICON BOND SUBSTRATE (DSB) AND HYBRID ORIENTATION TECHNOLOGY (HOT)

FIELD OF THE INVENTION

This invention relates to the field of semiconductor device manufacture, and more particularly to a method for reducing defects at an interface of two direct silicon bond wafer layers.

BACKGROUND OF THE INVENTION

As the semiconductor industry continues to increase performance of integrated circuit devices, physical limits of feature size are presenting new challenges to further improvement. For example, transistor gate lengths are approaching a value below which quantum effects cannot be neglected. Without new strategies, such challenges threaten to slow the rate of increase in device performance.

One such strategy involves increasing the mobility of minority charge carriers in a transistor so that the switching speed of the transistor may be increased without reducing the channel length of the transistor. A promising emerging technology referred to as "Hybrid Orientation Technology" (HOT) involves producing localized or "locally oriented" domains of crystal orientation on a semiconductor substrate. HOT technology operates on the principle that NMOS transistors can operate faster on one orientation of a substrate active area, such as <100>, while PMOS transistors may operate faster on an active area of a different orientation, such as <110>.

Processes to produce wafers incorporating HOT can use direct silicon bond (DSB) wafers. DSB wafers are formed using a handle wafer of a first silicon crystallographic orientation such as <100> and an overlying, cleaved wafer layer having a second crystallographic orientation such as <110> bonded to the handle wafer. A first portion of the <110> cleaved wafer layer is amorphized, for example using an implant of silicon, while a second portion of the cleaved wafer is not amorphized. The amorphized portion is recrystallized to take on the crystal orientation of the underlying silicon handle wafer, in this case <100>. Exposed surfaces of the resulting wafer assembly thus include <100> regions formed from the amorphized and recrystallized cleaved wafer layer comprising the DSB wafer and <110> regions formed from the original cleaved wafer layer which was not amorphized and recrystallized.

In subsequent processing, NMOS devices can be formed on the wafer assembly surface having the <100> orientation while PMOS devices are formed on the wafer assembly surface having the <110> orientation. Transistors formed in this way can have an increased speed because they benefit from being formed on the type of material most conducive to the flow of either electrons (NMOS devices) or holes (PMOS devices).

A method of forming a semiconductor wafer assembly with reduced defects would be desirable.

SUMMARY OF THE EMBODIMENTS

The following presents a simplified summary in order to provide a basic understanding of some aspects of one or more embodiments of the invention. This summary is not an extensive overview, nor is it intended to identify key or critical elements of the invention nor to delineate the scope of the invention. Rather, its primary purpose is merely to present one or more concepts in simplified form as a prelude to the detailed description presented later.

One embodiment of a method for forming a semiconductor device can comprise exposing an interface between an amorphized, recrystallized cleaved wafer layer having a first crystal orientation and an unamorphized cleaved wafer layer having a second crystal orientation different from the first crystal orientation to an etch using hydrochloric acid (HCl) to remove a crystallographic defect.

Another embodiment of a method used to form a semiconductor device can comprise dosing a semiconductor wafer substrate assembly comprising an exposed cleaved wafer portion and an unexposed cleaved wafer portion which overlies a semiconductor wafer with a silicon implant. The dosing is performed to amorphize the exposed cleaved wafer portion and to provide an amorphous silicon layer. Within an epitaxial reactor chamber, rapid thermal processing of the amorphous silicon layer can be performed to recrystallize the amorphous silicon layer and to provide a crystalline silicon layer and an interface between the amorphous silicon layer and the unexposed cleaved wafer portion. Within the epitaxial reactor chamber, an anneal of the interface is performed. Also within the epitaxial reactor chamber, the interface is exposed to a hydrochloric acid etch.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the drawings have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

During the production of semiconductor devices incorporating hybrid orientation technology (HOT), crystal defects can result, for example, during silicon phase epitaxy (SPE) which can be used to recrystallize an amorphous silicon region. These defects can form at an interface (i.e. at a "border region") of the <100> and <110> portions of the direct silicon bond (DSB) wafer, for example an unamorphized cleaved wafer portion, and an adjacent layer such as an amorphized and recrystallized cleaved wafer portion. Without being limited by theory, these defects may result from competition between vertical and lateral growth of the epitaxial layer. A high-temperature anneal process, for example above 1320° C., can be used to repair the defects. However, high temperature processes are undesirable, particularly with advanced CMOS device nodes with little processing latitude and can generate undesired thermal stresses which may result in wafer warping. Preserving the thermal budget is a goal of semiconductor process engineers.

An embodiment of the present invention comprises a process for reducing or eliminating interface defects which does not require a high-temperature anneal.

Figure 1:
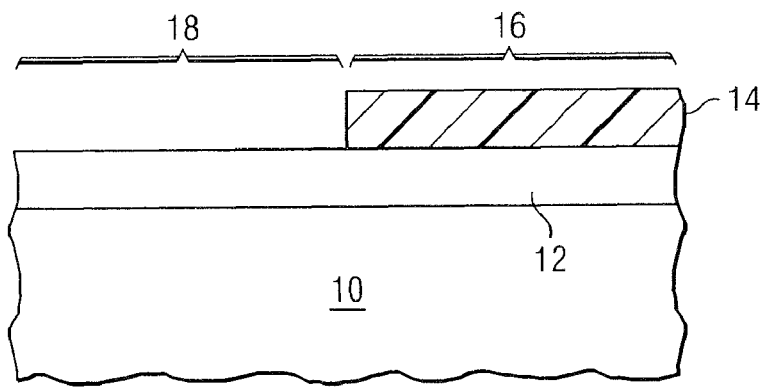
FIGS. 1-5 are cross sections depicting a portion of an in-process semiconductor wafer substrate assembly which can result from an inventive method of the present invention.

An exemplary embodiment of a process used to form surface layer comprising HOT technology is depicted in FIGS. 1-8. In FIG. 1, a semiconductor wafer substrate assembly can be provided which comprises a <100> handle wafer 10 and a <110> cleaved wafer layer 12, which together form a DSB wafer. Attachment between the handle wafer 10 and the cleaved wafer layer 12 to form the DSB wafer can be enhanced through an optional thin oxide layer (<1.5 nm) and a few monolayers of water for bonding. The oxide layer can then be dissolved using a post-bonding thermal process in an $N_2$ atmosphere at about 1200° C. for 30 minutes. The cleaved wafer layer 12 can have a thickness of between about 150 nm and about 250 nm. A patterned photoresist layer 14 can be formed to cover a first portion 16 of the cleaved wafer layer 12, while a second portion 18 of the cleaved wafer layer 12 remains exposed.

Figure 2:
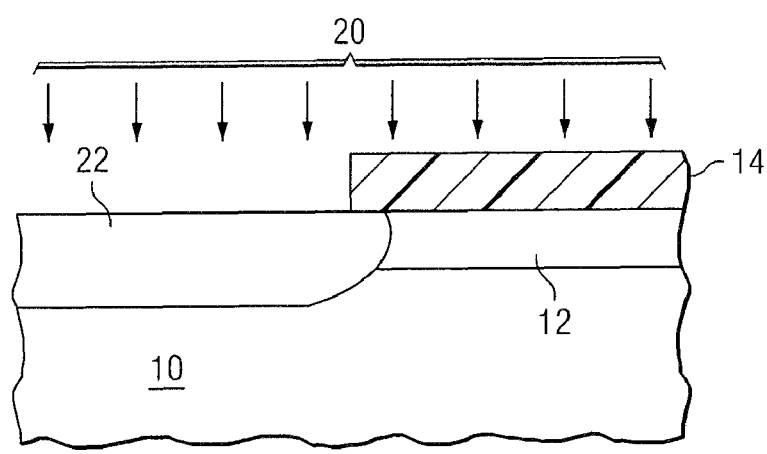

As depicted in FIG. 2, the exposed portion 18 of the cleaved wafer layer 12 can be dosed 20 and fully amorphized using a high dose silicon implant of Si+ II, for example using an energy of between about 120 keV and 150 keV, and a dose of between about $2.5E15/cm^2$ and about $5.0E15/cm^2$. A wafer tilt, for example at an angle of between about 5° and about 9°, and more particularly about 7°, can be employed. This process can fully amorphize the exposed portion 18 of the cleaved wafer layer 12 to provide an amorphous silicon layer 22 having a thickness of between about 180 nm to about 320 nm, for example about 313 nm.

Figure 3:
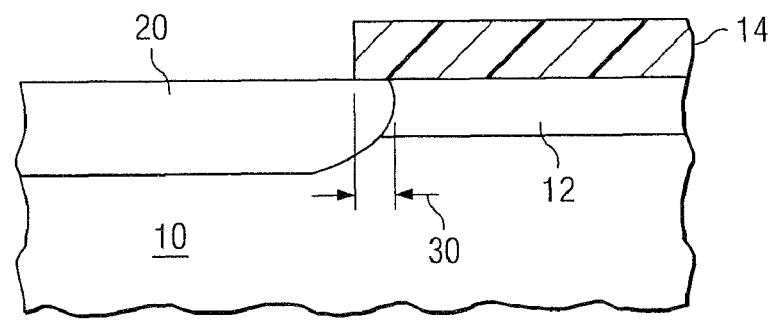

During the dosing process, lateral templating 30 can occur as depicted in FIG. 3. This results in partial amorphizing of the covered portion 16 of the <110> cleaved wafer layer 12 which is covered by the photoresist 14.

Figure 4:
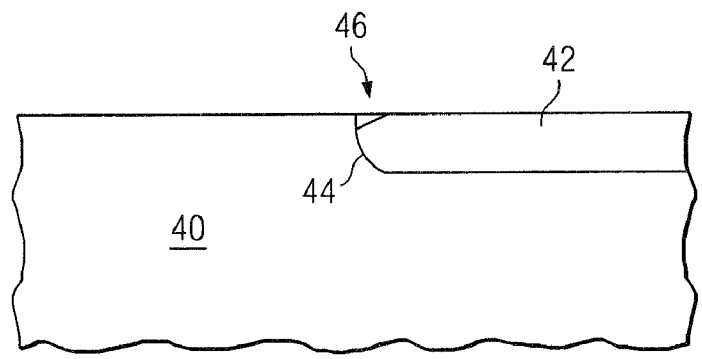

Next, a solid phase epitaxy (SPE) process can be performed, for example using rapid thermal processing (RTP) at a temperature of between about 550° C. and about 700° C., for example at about 650° C., for a duration of between about 300 seconds and about 2 hours in a nitrogen ($N_2$) ambient, to recrystallize the implanted, amorphous silicon areas and to change the crystal plane from amorphous to the <100> orientation. This can result in the structure depicted in FIG. 4 comprising a semiconductor wafer substrate assembly having a first portion 40 with a <100> crystal orientation and a second portion 42 having a <110> crystal orientation. During recrystallization, the amorphized cleaved wafer layer 20 of FIG. 3 recrystallizes from an amorphous state to a crystal state of the underlying <100> silicon wafer, to form a <100> crystalline silicon layer which is continuous with the original <100> handle wafer as depicted in FIG. 4, to form the <100> crystal 40. Good recrystallization stops on <111> planes originating from the initial amorphous silicon/crystalline silicon interface. This process results in a structure which can be used in a device comprising HOT technology. Also depicted in FIG. 4 is an interface 44 between the <110> crystal structure 42 and the <100> crystal structure 40, and a crystal defect 46 which can result during the SPE recrystallization. In this exemplary embodiment, the defect can be in the range of between about 45 nm and about 100 nm wide, although various factors can affect defect scaling. The defect can form to intersect the upper surface at an angle of about 54° on a first side, and at an angle of about 35° on a second side.

Figure 5:
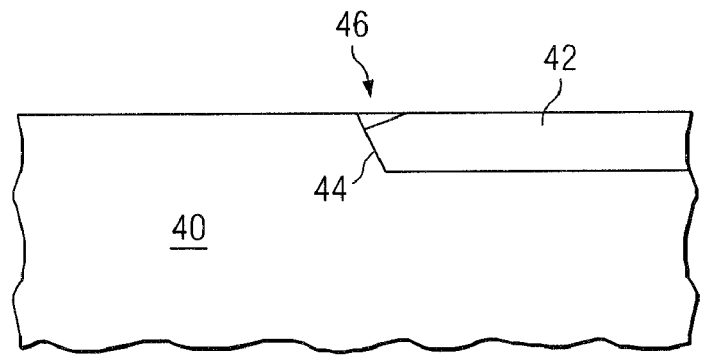
Figure 6:
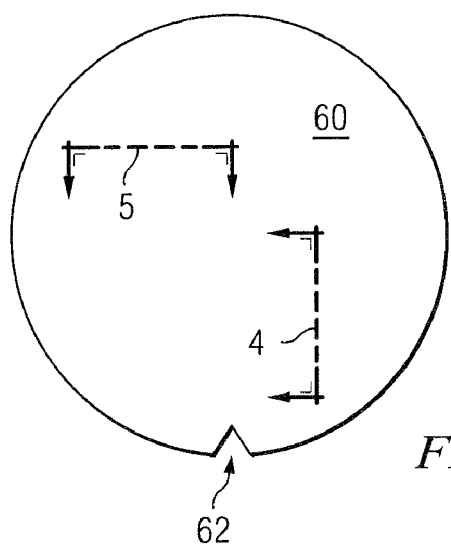
FIG. 6 is a plan view depicting, among other things, wafer locations of the cross sections of FIGS. 4 and 5.

FIG. 5 depicts the interface 44 and the crystal defect 46 at a cross section which is 90° relative to the FIG. 4 cross section. FIG. 6 is a plan view of a wafer 60 which comprises the structure of FIGS. 4 and 5, with the cross sectional direction of FIG. 4 depicted along "4-4", and the cross sectional direction of FIG. 5 depicted along "5-5" relative to a wafer orientation notch 62. Thus FIG. 4 is a cross section parallel to the notch, and FIG. 5 is a cross section perpendicular to the notch.

This embodiment can further comprise an anneal and an etch to remove the defect. For example, an in situ process can be performed within an epitaxial reactor chamber which is used to form the amorphized and recrystallized cleaved wafer layer. Performing various process stages within the epitaxial reactor chamber is preferred so that wafer transport can be minimized.

In the epitaxial reactor chamber, a damage anneal can performed, for example at a temperature of between about 1050° C. and about 1200° C., for example at about 1050° C., for a duration of about two hours in a nitrogen ($N_2$) ambient. The damage anneal can be performed to provide an initial reduction in the existing residual damage, for example end-of-range (EOR) damage at a lower surface near the silicon wafer.

Figure 7:
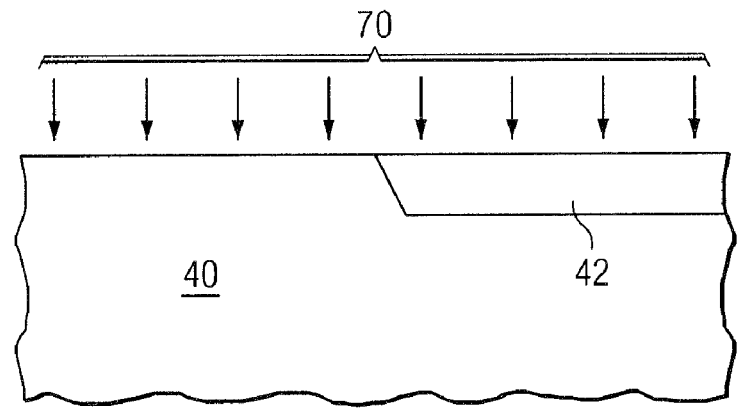
FIG. 7 is a cross section depicting an etch which can be used in an embodiment of the invention to remove a crystal defect.

After the damage anneal and within the epitaxial reactor, an in situ hydrochloric acid (HCl) etch 70 as depicted in FIG. 7 can be performed to uniformly remove a portion of the exposed upper surface, including a portion, or all, of the defect which remains after the damage anneal. For example, a thickness of between about 30 nm and about 60 nm can be etched from the upper portion of layers 40 and 42.

Figure 8:
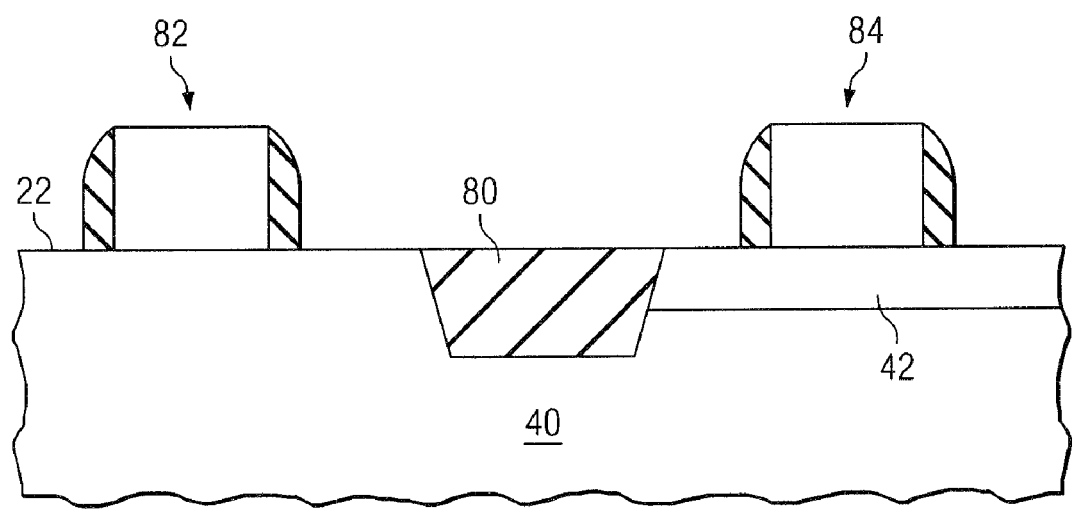
FIG. 8 is a cross section depicting NMOS and PMOS transistor devices formed over <100> and <110> semiconductor wafer substrate assembly portions.

After the HCl etch, additional subsequent processing sequences, such as those used to form the structure of FIG. 8, are contemplated. Processes can include an oxide wet removal followed by a shallow trench isolation (STI) process to form STI region 80. While the formation of STI at current processing nodes can be sufficient to remove the defect, the inventor has realized that this will not be the future device nodes in which the STI will be narrower than the defect. Thus repair of the defect will be necessary to maximize the wafer area on which devices can be formed on and within.

FIG. 8 further depicts an embodiment which can include the formation of NMOS transistor devices 82 over the <100> wafer layer 40, and PMOS devices 84 formed over the <110> epitaxial layer 42. Formation of the transistor devices will be readily apparent to one of ordinary skill in the art, and the resulting structure may comprise other features not individually depicted such as gate oxide, nitride capping layers, implanted source/drain regions, etc. PMOS devices have improved speed when formed over <110> silicon (i.e. its active area is within <110> silicon) than when formed over <100> silicon, as <110> silicon is better suited for the conduction of holes. NMOS devices have improved speed when formed over <100> silicon (i.e. its active area is within <100> silicon), which is more conducive to the flow of electrons than <110> silicon.

While the embodiments described above reference the use of a <100> silicon semiconductor wafer, a <110> cleaved wafer layer, and a <100> amorphized and recrystallized layer, other embodiments are contemplated which will reduce interface defects and minimize interface morphology. For example, the semiconductor wafer can comprise a <110> orientation, the cleaved wafer layer can be <100>, and the amorphized and recrystallized layer can be <110>. Other arrangements of crystallographic orientation are also within the scope of the present invention, and modifications to the described embodiments will be evident to those of ordinary skill in the art without departing from the scope of the present invention.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:
1. A method for forming a semiconductor device, comprising:
providing a direct silicon bond (DSB) wafer comprising a cleaved silicon wafer layer having one of a <100> or <110> crystallographic orientation over a semiconductor wafer having the other of a <100> of <110> crystallographic orientation;
forming a patterned photoresist layer over the cleaved wafer layer to cover a first portion of the cleaved wafer layer with the photoresist and to leave a second portion of the cleaved semiconductor wafer layer exposed;
dosing the second portion of the cleaved wafer layer with silicon to convert the second portion of the cleaved wafer layer to amorphous silicon and to leave the first portion of the cleaved wafer layer to have the one of the <100> or <110> crystallographic orientation;
in an epitaxial reaction chamber, exposing the amorphous silicon to an epitaxy process to convert the amorphous silicon to have the other of the <100> or <110> crystallographic orientation and to form a crystal defect at an interface border region of the first portion and the converted amorphous silicon;
in situ in the epitaxial reaction chamber, annealing at a temperature of about 1200° C. or less to provide an initial reduction in residual crystal defect damage resulting during recrystallization at the interface border region;
in situ in the epitaxial reaction chamber, exposing the interface border region to a hydrochloric acid etch process to remove a portion of an upper surface of the first and second portions, including at least a portion of any defect damage remaining at the interface border region after the initial reduction;
following the hydrochloric acid etch process, forming a shallow trench isolation region at the interface border region, wherein a width of the shallow trench isolation is narrower than a width of the crystal defect;
following the hydrochloric acid etch process, forming an NMOS transistor on the first portion or converted amorphous silicon second portion having the <100> crystallographic orientation; and
following the hydrochloric acid etch process, forming a PMOS transistor on the first portion converted amorphous silicon second portion having the <110> crystallographic orientation.
2. The method of claim 1, wherein the annealing is done at a temperature of between about 1050° C. and about 1200° C. for a duration of about 2 hours in a nitrogen ambient.
3. A method for forming a semiconductor device, comprising:
providing a direct silicon bond (DSB) substrate having a cleaved wafer layer comprising silicon with one of a <100> or <110> crystal orientation over a handle wafer comprising silicon with the other of the <100> or <110> crystal orientation;
forming a mask to cover a first portion of the cleaved wafer layer, leaving a second portion of the cleaved wafer layer exposed;
implanting silicon to fully amorphize the silicon in the exposed second portion and to at least partially amorphize the silicon in an interface border region between the covered first portion and the exposed second portion, leaving a remainder of the silicon in the covered first portion unamorphized;
in an epitaxial reactor chamber, performing rapid thermal processing of the amorphous silicon at a temperature of about 700° C. or less, to recrystallize the amorphized silicon in the second portion and the interface border region, to change its crystal orientation to the other of the <100> or <110> crystal orientation;
in situ in the epitaxial reactor chamber, performing a damage anneal at a temperature of about 1200° C. or less, to provide an initial reduction in residual crystal defect damage resulting during the recrystallization in the interface border region;

in situ in the epitaxial reactor chamber and following the damage anneal, performing a hydrochloric acid etch to uniformly remove a portion of an upper surface of the first and second portions of the cleaved wafer layer, including at least a portion of any defect damage remaining in the interface border region after the damage anneal; and following the hydrochloric acid etch, forming a shallow trench isolation region in the interface border region.

4. The method of claim 3, wherein the damage anneal is performed at a temperature of between about 1050° C. and about 1200° C. for a duration of about 2 hours in a nitrogen ambient.

* * * * *